United States Patent [19]
Jensen et al.

[11] Patent Number: 5,724,003
[45] Date of Patent: Mar. 3, 1998

[54] METHODS AND APPARATUS FOR SIGNAL AMPLITUDE CONTROL SYSTEMS

[75] Inventors: Brent R. Jensen, Portland; James W. H. Marsh, Sherwood, both of Oreg.

[73] Assignee: Maxim Integrated Products, Inc., Sunnyvale, Calif.

[21] Appl. No.: 581,033

[22] Filed: Dec. 29, 1995

[51] Int. Cl.[6] .................................................... H03G 3/30
[52] U.S. Cl. ........................ 330/129; 330/140; 330/279
[58] Field of Search ............................ 330/85, 129, 140, 330/279, 289

[56] References Cited

U.S. PATENT DOCUMENTS

| | | | |
|---|---|---|---|
| 3,918,003 | 11/1975 | Seidel | 330/279 |
| 5,208,550 | 5/1993 | Iwane | 330/129 |
| 5,214,393 | 5/1993 | Aihara | 330/279 |
| 5,376,895 | 12/1994 | Aihara | 330/129 |

*Primary Examiner*—Steven Mottola
*Attorney, Agent, or Firm*—Hickman Beyer & Weaver

[57] ABSTRACT

A method for obtaining a rectified signal from a first alternating current signal. The method includes the step of inputting the first alternating current signal into a variable gain amplifier to obtain a second alternating current signal. The second alternating current signal has a substantially constant peak-to-peak voltage irrespective of a power level of the first alternating current signal. The method further includes the step of rectifying the second alternating current signal, using a power detector circuit, to obtain the rectified signal, whereby a direct current level of the rectified signal is substantially proportional to the power level of the first alternating current irrespective of the power level of the first alternating current. The rectified signal may then be employed in, for example, a feedback control circuit to control the amount of power output by an RF signal source.

14 Claims, 6 Drawing Sheets

METHODS AND APPARATUS FOR SIGNAL AMPLITUDE CONTROL SYSTEMS

BACKGROUND OF THE INVENTION

The present invention relates to amplitude-controlled signal sources. More particularly, the invention relates to methods and apparatus for signal amplitude control systems.

Radio frequency (RF) signal sources are circuits that generate, in response to a control input, amplitude-controlled output signals having variable amplitudes. FIG. 1 is a block diagram illustration showing an RF signal source 100, which receives a user-supplied control signal 102. User-supplied control signal 102 is a direct current (d.c.) voltage signal and is typically derived from the digital output of a microprocessor, a microcontroller, or similarly suitable logic circuits through, for example, a conventional digital-to-analog converter (DAC). Responsive to the d.c. voltage level on user-supplied control signal 102, RF signal source 100 generates an amplitude-controlled output signal 104. The amplitude-controlled output signal 104 may then be employed to drive a load 106, representing a resistive load or an antenna such as that found in a cordless or a cellular phone of modem communication systems.

Ideally, all RF signal sources should produce the same output power level for a given control input d.c. voltage level. Due to temperature-induced variations, manufacturing tolerances, and others, however, the parts within different RF signal sources may cause those RF signal sources to output different levels of power for a given control input d.c. voltage level. To keep the output power of RF signal sources within a specified range, a calibration scheme is usually necessary.

If the response of the RF signal source is linear, i.e., its output power level or voltage level varies linearly with the d.c. voltage level of its control input, and there is no temperature-dependent fluctuations, calibration may be performed in a relatively straight-forward manner. To facilitate discussion, FIG. 2 shows a line 110 on a plot of RF signal source output power level (shown in dBm) vs. the d.c. voltage level of the RF signal source control input signal. Line 110 represents the ideal linear response of an RF signal source, in which a linear increase or decrease in the control input d.c. voltage level results in a corresponding linear increase or decrease in the output power level of the amplitude-controlled output signal.

The ideal RF signal source associated with line 110 may be calibrated by measuring its output power levels at two points on line 110, e.g., points 112 and 114, and noting the required control input d.c. voltage levels at those two points. The d.c. voltage level of the control input that is required to obtain any desired output power level on line 110, e.g., at point 116, may then be calculated simply by extrapolating along the slope of line 110. By appropriately modifying the control input signal voltage level, the ideal RF signal may then be compensated, e.g., for its manufacturing tolerances.

Unfortunately, prior art RF signal sources have been far from ideal. The response of a typical prior art RF signal source may, for example, resemble that of curve 120 due to the nonlinear relationship between its output power vs. the d.c. voltage level of the control input. Because of this nonlinearity, the calibration of the prior art RF signal sources requires much additional work. For example, it is not possible to derive the required d.c. voltage level of the control input at point 122 simply by calibrating at points 124 and 126 on curve 120. To calibrate the prior art RF signal source that is associated with curve 120, it is typically necessary to learn its response by sampling along line 120 at discrete intervals. From the sampling data, a lookup table may then be constructed. This lookup table may then be employed to modify the d.c. voltage level of the control input (by, e.g., modifying the aforementioned digital signal from the microcontroller) to calibrate the prior art RF signal source.

Further, the power response of prior art RF signal sources is temperature dependent. For a given control input d.c. voltage level, its output power level changes responsive to changes in temperature. Accordingly, the aforementioned calibration procedure must also be performed at different temperatures to ensure that a given control input d.c. voltage level can generate the appropriate desired output power level at a given temperature.

To explore the difficulties experienced in the prior art, FIG. 3 shows a prior art RF signal source 300, including an RF power amplifier 302 and a power controller circuit 304. Responsive to a user-supplied control signal on a terminal 306, RF power amplifier 302 varies the power level of the output signal on line 308 to cause RF signal source 300 to output a desired power level.

Power controller circuit 304 represents the control circuit for detecting the amount of power output by RF power amplifier 302 and controlling RF power amplifier 302, if necessary, to ensure that the desired power output level is maintained for a given control signal voltage level on terminal 306. In FIG. 3, a line coupler 310, also known as a directional coupler, samples a fraction of the output power on line 308 and provides a sensed signal on a line 312 to a power detector 314 of power controller circuit 304. In a typical prior art RF signal source, power detector 314 may be implemented by, for example, a Schottky barrier diode-based rectifier.

Power detector 314 rectifies the sensed signal on line 312 and outputs a rectified signal on a line 316 to an error amplifier 318. Error amplifier 318 compares the signals on line 316 and terminal 306 and outputs an error signal on line 320 to control the amount of power output by RF power amp 302. In the example of FIG. 3, error amplifier 318 is implemented by an operational amplifier, which is arranged in a conventional integrating amplifier arrangement.

If the d.c. voltage level on line 316 (i.e., the output of power detector 314) is lower than that at terminal 306 (i.e., the user-supplied control signal), error amplifier 318 will integrate upward to increase the d.c. voltage level of the error signal on line 320. This causes RF power amplifier 302 to increase its output on line 308, which is sensed through line coupler 310 by power detector 314. RF power amplifier 302 continues to increase its output until the d.c. voltage levels on line 316 and terminal 306 are approximately equal. As is seen, power controller 304 increases the output of RF power amplifier 302 whenever the d.c. voltage level of the user-supplied control signal increases (i.e., power controller acts to increase the output power level responsive to an increase in the d.c. level of the user-supplied control signal) or whenever the power level of the RF signal source output on line 308 drops below the level specified by the user-supplied control signal (i.e., power controller 304 acts to correct a drop in the output power level).

The typical power detector 314 is, however, nonlinear in its rectifying characteristics over a wide dynamic range, e.g., over 30 dB of the output signal on line 308. In other words, the transfer characteristics between the sensed signal on line 312 and the rectified signal on line 316 is nonlinear for different output power levels on line 308. This nonlinearity affects the response of error amplifier 318, which in turn causes the error signal on line 320, which controls the RF power amplifier 302, to be nonlinear. As a result, prior art power control 304 results in, for different power levels output by RF power amplifier 302, a nonlinear relationship between the voltage level of the user-supplied control signal on terminal 306 and the power level output by the RF signal source on line 308.

Since a wide dynamic range, i.e., a wide range of output power levels, is necessary in modem communication systems, this nonlinearity must be compensated for in the control algorithm that generates the user-supplied control signal at terminal 306. The same nonlinearity also complicates the aforementioned calibration procedure, typically requiring the sampling of the output power levels on line 308 at discrete increments in the voltage level of the user-supplied control signal.

As mentioned earlier, the transfer characteristics of power detector 314 is temperature dependent. At different temperatures, the rectified signal on line 316 may vary for a given power level of the sensed signal on line 312. In the prior art, this temperature dependence must again be accounted for in the control algorithm that generates the user-supplied control signal at terminal 306 and in the calibration procedure, i.e., by sampling the output power level on line 308 at different temperatures. As can be seen, the prior art power control architecture requires elaborate compensation and calibration procedures.

Alternative approaches in the prior art to linearize the power detector over a wide dynamic range unfortunately give rise to other problems. For example, another well known prior art power controller architecture utilizes a logarithmic amplifier strip structure as power detector 314 to achieve linear power detection over a wide dynamic range. However, the aforementioned logarithmic amplifier strip structure tends to be bandwidth-limited, i.e., it is unable to linearize power detection at high frequencies. For example, it has been found that the logarithmic amplifier strip structure does not satisfactorily provide linear power detection at above 800 MHz over a 30–40 dB dynamic range at a power supply consumption level that is appropriate for low power applications.

In view of the above, what is desired is an improved signal amplitude control system that is more linear in its transfer characteristics and is more temperature independent. Furthermore, the improved signal amplitude control system preferably operates at a high bandwidth and a high dynamic range to accommodate the requirements of modem RF circuits, such as those employed in wireless communication systems.

SUMMARY OF THE INVENTION

The present invention relates, in one embodiment, to a power controller circuit for generating an error signal from an alternating current output signal of a power amplifier, a reference voltage level, and a control signal. The power controller circuit includes a power sampler circuit for sampling a portion of the output signal and outputting a sensed signal, which is proportional to a power level of the output signal. There is further included a variable gain amplifier having a first variable gain amplifier input and a second variable gain amplifier input. The first variable gain amplifier input is coupled to the power sampler circuit for receiving the sensed signal while the second variable gain amplifier input receives the control signal. The variable gain amplifier functions to output a variable gain amplifier output signal having a substantially constant peak-to-peak voltage irrespective of a power level of the output signal of the power amplifier.

There is further provided a power detector circuit coupled to the variable gain amplifier for receiving the variable gain amplifier output signal and for outputting a rectified signal. Additionally, there is provided an error amplifier having a first error amplifier input and second error amplifier input. The first error amplifier input is coupled to the power detector circuit for receiving the rectified signal while the second error amplifier input is coupled to the reference voltage level, whereby the error amplifier outputs the error signal responsive to a difference between the rectified signal and the reference voltage level.

In another embodiment, the present invention relates to a method for obtaining a rectified signal from a first alternating current signal. The method includes the step of inputting the first alternating current signal into a variable gain amplifier to obtain a second alternating current signal. In this embodiment the second alternating current signal has a substantially constant peak-to-peak voltage irrespective of a power level of the first alternating current signal. The method further includes the step of rectifying the second alternating current signal, using a power detector circuit, to obtain the rectified signal, whereby a direct current level of the rectified signal is substantially proportional to the power level of the first alternating current irrespective of the power level of the first alternating current.

These and other advantages of the present invention will become apparent upon reading the following detailed descriptions and studying the various figures of the drawings.

DETAILED DESCRIPTION OF THE PREFERRED EMBODIMENTS

Figure 1:
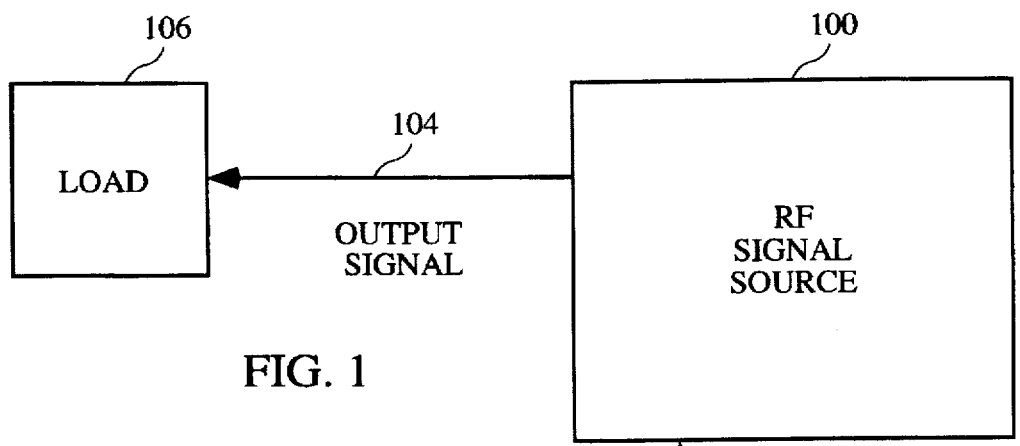
FIG. 1 is a block diagram illustration showing an RF signal source, its control input, and its variable output.
Figure 2:
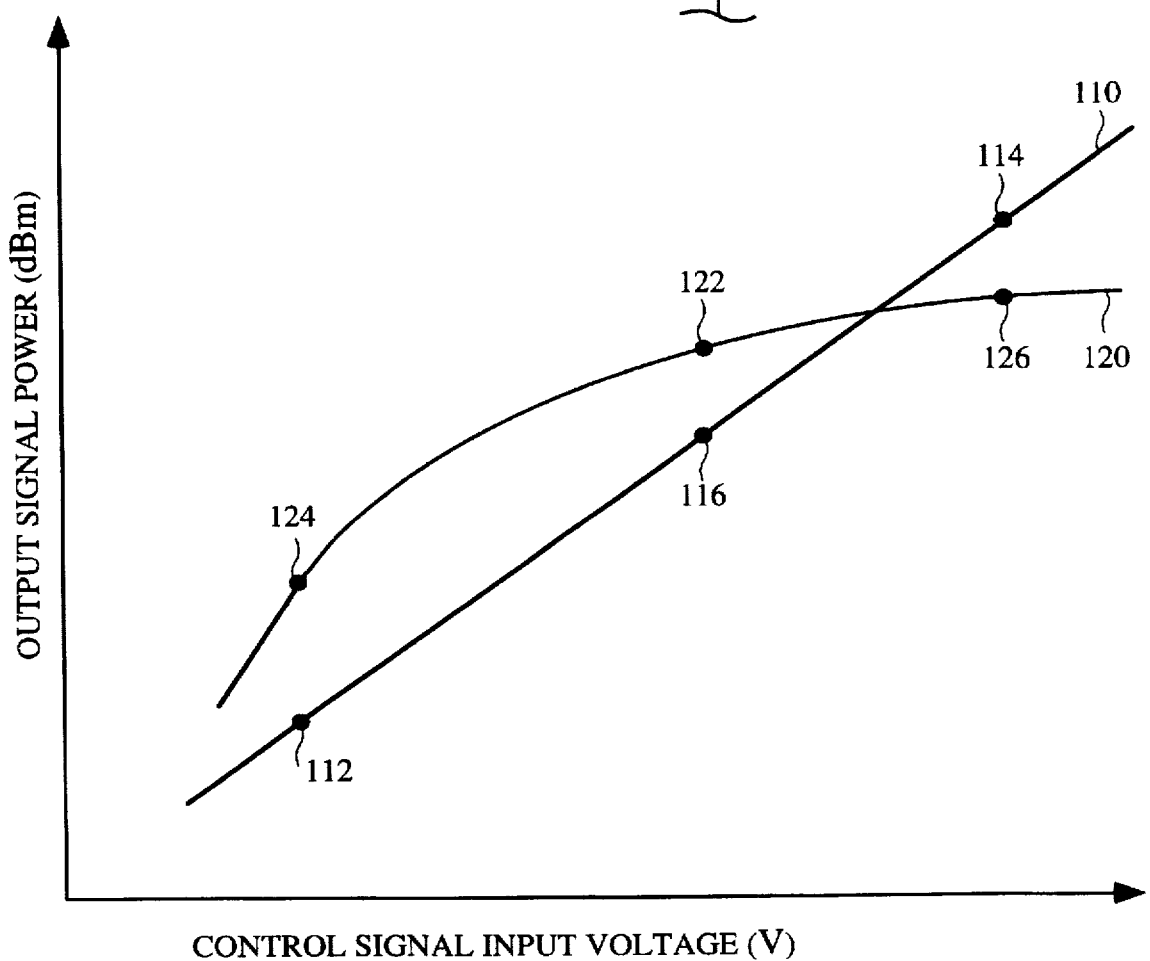
FIG. 2 is a plot of the RF signal source output power level (shown in dBm) vs. the d.c. voltage level of its control input.
Figure 3:
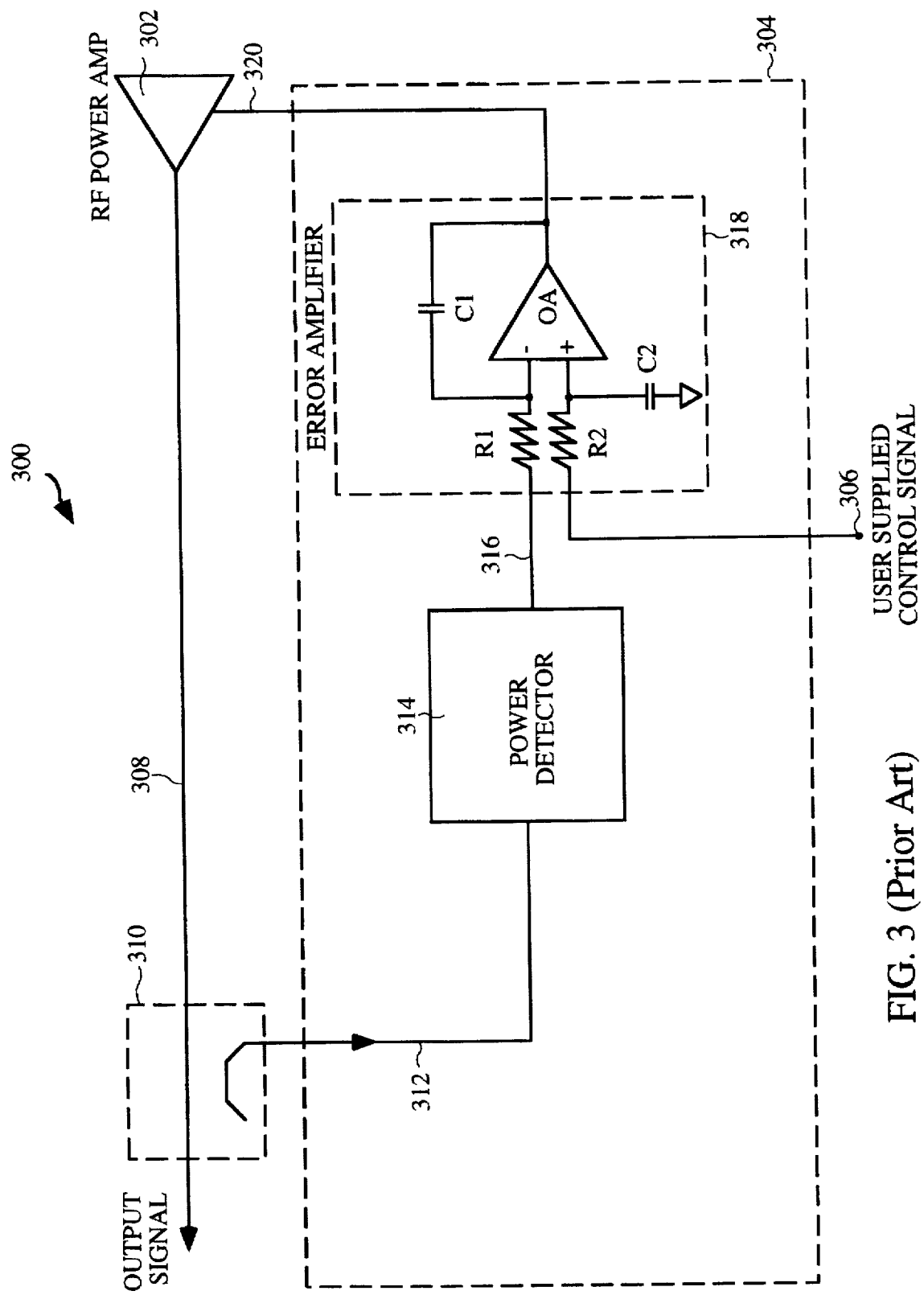
FIG. 3 shows a prior art RF signal source.

As discussed above, FIG. 1 is a block diagram illustration showing an RF signal source, its control input, and its variable amplitude-controlled output signal. FIG. 2 is a plot of the RF signal source output power level (shown in dBm) vs. the d.c. voltage level of its control input. FIG. 3 shows a prior art RF signal source.

The invention relates, in one embodiment, to a power controller that advantageously provides linear power detection (i.e., detects the power output by the RF power amplifier in a linear manner). Unlike prior art power controller schemes, the power controller of the present embodiment remains linear over a wide range of RF amplifier output power, e.g., up to 40 dB, and at high frequencies, e.g. 800 megahertz and above, up to 2.5 gigahertz.

Figure 4:
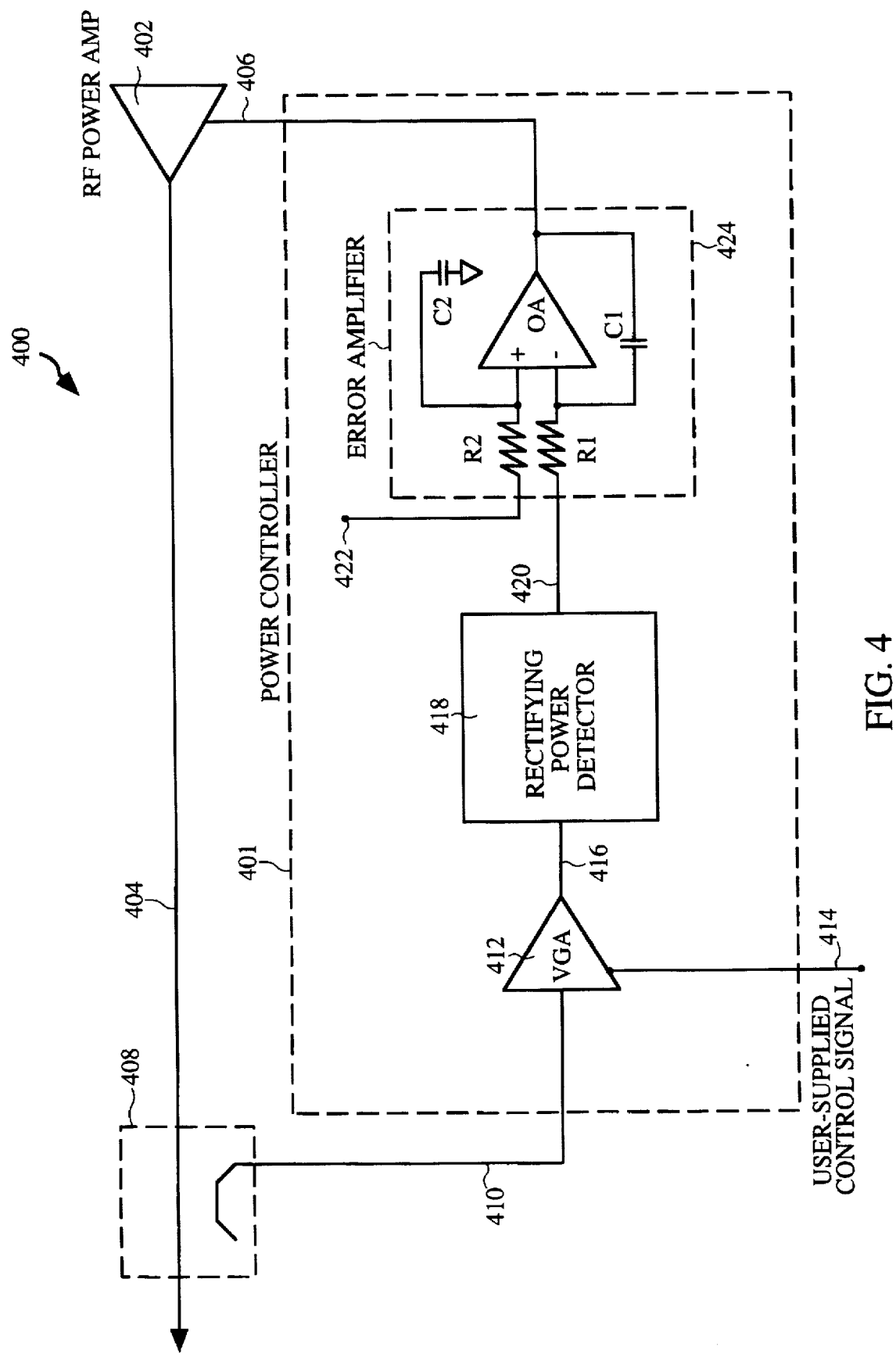
FIG. 4 shows, in accordance with one embodiment of the present invention, an RF signal source having a linearized power controller.

FIG. 4 illustrates, in one embodiment, an RF signal source 400 that advantageously employs the inventive power controller 401 to sense and regulate the amount of power output by an RF power amplifier 402. RF power amplifier 402 represents a voltage-controlled gain amplifier of a conventional design in which the power, i.e., the amplitude, of its a.c. output signal (herein "amplitude-controlled signal") on line 404 varies responsive to the d.c. level of its control signal on line 406.

The amplitude-controlled signal on line 404 is sampled by a power sampler circuit 408, which outputs an alternating current (a.c.) sensed signal on line 410, whose power is proportional to the power level of the amplitude-controlled signal on line 404. In one embodiment, power sampler circuit 408 represents the familiar directional coupler or line coupler device for sampling a portion of the power level on line 404. It is contemplated, however, that other known power sampler circuit designs, including transformer-based designs, may well be employed in power sampler circuit 408.

The sensed signal on line 410 has substantially the same bandwidth and dynamic range as those of the signal it represents, i.e., the amplitude-controlled signal on line 404. If this sensed signal is rectified directly by a power detector circuit, as was done in the prior art by power detector 314 of prior art FIG. 3, the wide dynamic range of this sensed signal will result in a nonlinear transfer characteristic between the input and the output of the power detector. This is because power detectors are, as is well known, inherently nonlinear over a wide dynamic range, e.g., above 10 dB.

To facilitate highly linear power detection over a wide dynamic range, e.g., above about 30 dB and up to about 40 dB in one embodiment, as well as at high frequencies, e.g., above about 800 mega-hertz and up to about 2.5 giga-hertz as in the case of wireless or cellular communication systems, the inventive power controller circuit advantageously senses the wide dynamic range output signal on line 404 but presents a signal having only a narrow dynamic range to the input of the power detector. With reference to FIG. 4, the sensed signal on line 410 is first "conditioned" by a variable gain amplifier (VGA) 412, which takes as its input the sensed signal on line 410 and either amplifies or attenuates the power of the sensed signal to output, responsive to a user-supplied control signal on line 414, a variable gain amplifier (VGA) output signal on line 416.

The aforementioned user-supplied control signal represents, in one embodiment, the signal used for controlling the amount of power output by RF power amplifier 402. This user-supplied control signal may be generated by any number of conventional methods. In one embodiment, this user-supplied control signal is generated by a microcontroller, a microprocessor, or digital logic circuitry through a digital-to-analog converter (DAC) of a conventional design.

VGA 412 represents, in one embodiment, the well-known variable gain amplifier and is preferably selected from conventional designs that permit amplification (and concomitantly attenuation) over the high dynamic range and the high frequencies of interest. In one example, VGA 412 may comprise multiple cascaded VGA stages to improve its dynamic range and bandwidth.

Further, VGA 412 may be selected to have a gain control that is either linear in voltage (i.e., its output voltage varies linearly with the voltage level of its control signal on line 414) or, preferably, linear in dB (i.e., the output signal power in watts varies exponentially with the voltage level of its control signal on line 414) for a high dynamic range. The selection of an appropriate VGA 412 among the conventional and known designs for a particular dynamic range and other power control characteristics is well within the ability of those skilled in the art.

As is seen in FIG. 4, power sampling circuit 408, VGA 412, power detector 418, and error amplifier 424 form the feedback control loop of RF signal source 400. When the control loop of RF signal source 400 is stable, VGA 412 will attenuate large sensed signals on line 410 or amplify small sensed signals on line 410 to maintain a relatively constant amplitude for its a.c. output signal on line 416. Advantageously, the VGA output signal on line 416 has a dynamic range that is substantially narrower than that of the sensed signal on line 410.

The VGA output signal on line 416 is then input into a power detector circuit 418. Power detector circuit 418 represents a circuit of a conventional design for obtaining a d.c. output signal from an a.c. input signal. To function in a communication system, e.g., a wireless or cordless phone, the power detector circuit should be able to detect power at the high operating frequencies of these systems. Suitable power detector circuits include those employing diodes, full wave rectifiers, or thermal transducers such as bolometers.

Because power detector 418 only has to rectify a signal having a narrow dynamic range, i.e., a relatively constant amplitude a.c. signal, the dynamic range-related nonlinearity is advantageously removed from the control loop of RF signal source 400. Furthermore, the voltage gain of VGA 412 may be chosen such that detection occurs near or at the optimum detection point of power detector circuit 418, i.e., the point at which the detection characteristics of the power detector is most linear and the bandwidth is maximized. In so doing, power detection accuracy is further improved. Without the fluctuations in the power level of its input signal, power detector circuit 418 performs power detection in a more linear manner, advantageously simplifying any correction that has to be performed at that power range (due to, e.g., process variations in the manufacture of the components of power controller 401) as well as simplifying the calibration of the resulting RF signal source 400.

The relatively constant amplitude of the VGA output signal on line 416 produces a relatively constant d.c. signal at the output of the power detector circuit. This rectified signal (shown on line 420 of FIG. 4) is then compared against a reference signal on a terminal 422 by an error amplifier 424. In the embodiment of FIG. 4, error amplifier 424 is implemented by an operational amplifier, which is configured in a conventional integrating amplifier arrangement. It is contemplated, however, that other conventional and well-known amplifying circuits for comparing the difference between its input signals and outputting an error signal may well be employed.

Responsive to the difference between its two inputs, error amplifier 424 generates an error signal on line 406, which is then used as a control signal to set the gain of RF power amplifier 402. In this manner, a closed loop is formed with power controller circuit 401 sensing, through power sampler circuit 408, the level of power output by RF power amplifier 402 and adjusting that power level to correspond to the power level set by the user-supplied control signal on line 414. The advantage of the present architecture lies, among others, in the fact that power detection by power detector circuit 418 is performed within a narrow dynamic range, thereby improving linearity while preserving both the high bandwidth and wide dynamic range.

Reference signal 422 is either a fixed d.c. voltage level, a temperature compensated d.c. voltage level, or a variable d.c. voltage signal that is either internally or externally supplied. A variable reference signal may be used to, for example, adjust power controller 401 to compensate for process variations in the manufacture of the components of RF signal source 400, e.g., in the gain error of RF power amplifier 402, in power detector 418, or in other components of the RF signal source, so that a given user-supplied control signal on line 414 will generate the same level of output power on line 404. In this manner, absolute accuracy across RF signal sources can be set.

To illustrate the operation of the inventive power control circuit, consider the situation where the user wishes to increase the power level output by RF signal source 400. To do so, the d.c. voltage level of the user-supplied control signal on line 414 is increased. Temporarily, this decreases the a.c. level, i.e., the peak-to-peak and RMS voltage level, of the VGA output signal on line 416. In turn, the rectified signal on line 420 out of power detector circuit 418 is decreased. Error amplifier 424, upon sensing the decreased voltage level on line 420 will cause an increase in the voltage of the error signal on line 406, which in turn increases the amount of power output by RF power amplifier 402.

This increased power level output by RF power amplifier 402 on line 404 will be sensed by power sampler circuit 408, resulting in an increase in the sensed signal on line 410. The power level on line 404 (and concomitantly on line 410) will continue to increase until VGA 412 pulls the VGA output signal on line 416 back up to its previous a.c. level to stabilize the feedback loop. At this point, the power output by RF signal source 400 is stable and proportional to the d.c. voltage level of the user-supplied control signal on line 414.

Conversely, a decrease in the voltage level of the user-supplied control signal on line 414 will result in a temporary increase in the a.c. level of the VGA output signal on line 416. Correspondingly, the rectified signal on line 420 is increased, resulting in a decrease in the voltage level of the error signal on line 406. Consequently, less power is output by RF power amplifier 402 and sensed by power sampler circuit 408. The power level output by RF power amplifier 402 will continue to decrease until VGA 412 pulls the VGA output signal on line 416 back down to its previous a.c. level to stabilize the feedback loop. At this point, the power output by RF signal source 400 is again stable and proportional to the d.c. voltage level of the user-supplied control signal on line 414.

As can be seen from the foregoing, the present invention advantageously employs one or more VGA stages to "absorb" the dynamic range of the output signal on line 404 and presents a more limited dynamic range to power detector circuit 418. Advantageously, the linearity of the power detection process is improved, with a corresponding improvement in the linearity of the relationship between the voltage level of the user-supplied control signal on line 414 and the level of power output in dBm on line 404. If VGA 412 is chosen to be linear in voltage (instead of linear in dB), note that this linearity would appear in the relationship between the voltage level of the user-supplied input control signal on line 414 and the voltage level of the output signal on line 404, which tends to increase detection accuracy, albeit at a reduced dynamic range. In any case, this linear amplitude control feature permits simple calibration schemes to be employed, advantageously permitting the inventive RF signal source to be calibrated using only two calibration points (as discussed earlier in connection with FIG. 2).

Most importantly, the power control circuit of FIG. 4 can operate at a high bandwidth and a wide dynamic range. For example, it is found that the inventive architecture is highly suitable for communication systems which specifies 30–40 dB of dynamic range at frequencies above 800 megahertz up to 2.5 gigahertz, e.g., cordless phones, cellular phones, or PCS phones utilizing, for example, the GSM protocol.

In addition to the aforementioned benefits, it is found that the power control architecture of the present invention can be realized on standard high speed bipolar technology. It should be borne in mind at this point that although high speed bipolar technology is preferred, it is contemplated that other technologies such as GaAs, CMOS, BiCMOS, may well apply. Using standard technologies, it is possible to integrate most components of power controller 401 on a single integrated circuit (IC) chip, with an optional provision for externally coupling the capacitor C1 of error amplifier 424. The reference signal at terminal 422 may be internally provided or it may be externally specified or modified through a pin on the IC. Compared to existing power control schemes which utilize discrete components, the ability to functionally integrate the components of power controller 401 into a single IC advantageously saves board space and component cost.

In another embodiment, an additional temperature compensation circuit of a conventional design may be provided to correct for temperature-related errors in power detector circuit 418. In one example, a temperature compensation circuit is integrated into the design of a full wave rectifier, i.e., fabricated on the same IC to implement power detector circuit 418.

Figure 5A:
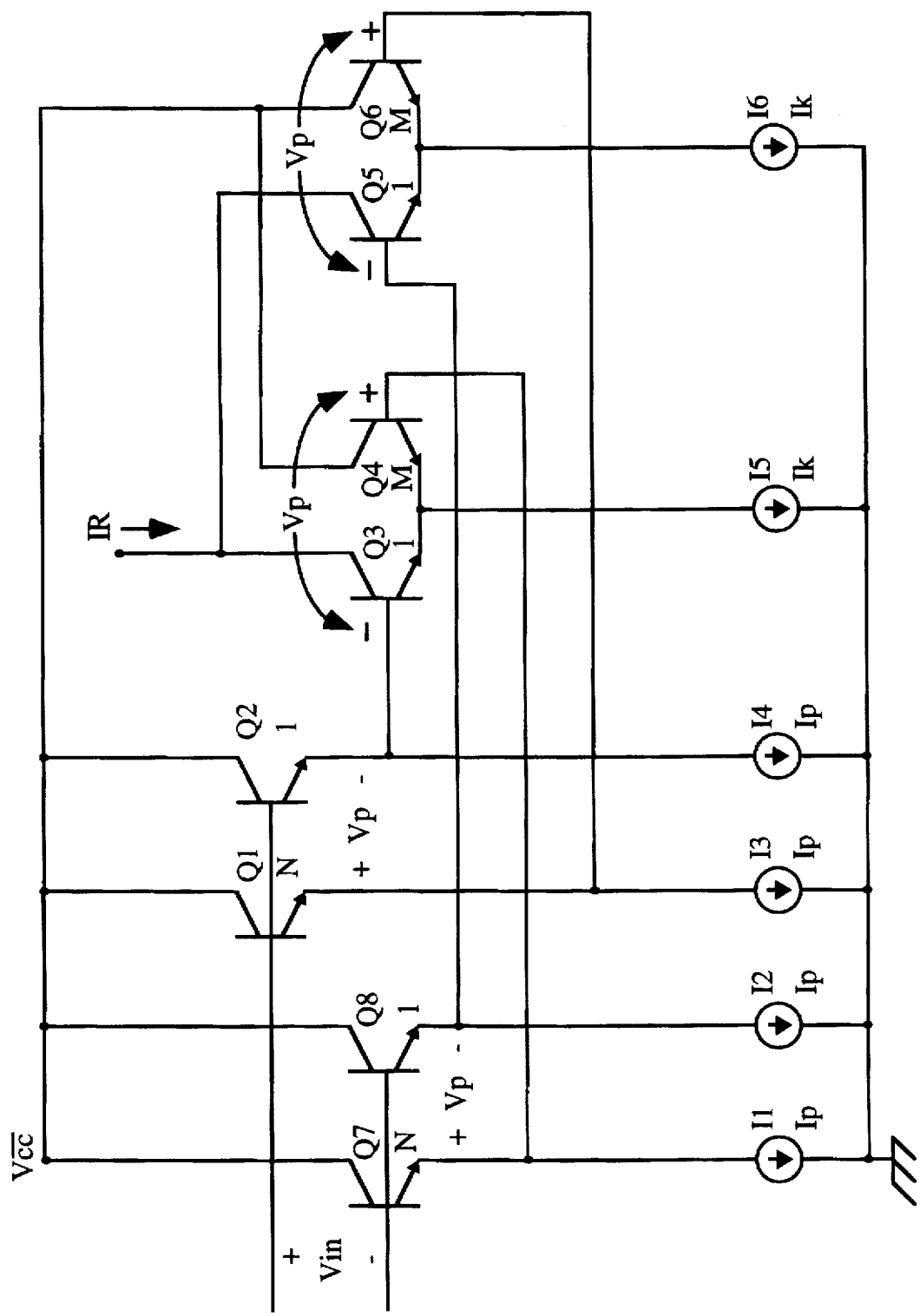
FIG. 5A shows, in accordance with another embodiment of the present invention, a power detector circuit, including the temperature compensation circuitry, that is suitable for use in the inventive power controller.

FIG. 5A shows, in accordance with another embodiment of the present invention, a power detector circuit, including the temperature compensation circuitry, that is suitable for use in the inventive power controller. In FIG. 5A, a temperature-compensated logarithmic full-wave detector is employed as a power detector. The detector biasing scheme relies on the inherent excellent matching of integrated bipolar transistors. Transistor pairs Q1/Q2 and Q7/Q8 are connected in the form of emitter followers that buffer the differential detector cell input, Vin. Transistors Q1 and Q2 have a relative area ratio of N:1, as do transistors Q7 and Q8. These emitter followers are all biased at the same current, Ip, via current sources I1, I2, I3, and I4. Under these conditions, the voltage between emitters, shown in FIG. 5A as Vp, is independent of the bias current Ip and is proportional to absolute temperature (PTAT).

$$Vp = \Delta Vbe = Vt \ln(N) \qquad \text{(Eq. 1)}$$

This PTAT voltage Vp is used to bias the full-wave detector cell formed by transistors Q3–Q6. Transistors Q3 and Q4 have a relative area ratio of M:1, as do transistors Q5 and Q6. Each differential pair is biased with a current Ik. For accurate logarithmic operation, current Ik is usually set to be constant with temperature.

Transistor pair Q3 and Q4, which are connected between the emitters of transistors Q2 and Q7, rectify positive input transitions. Transistor pair Q5 and Q6, which are connected between the emitters of transistors Q1 and Q8, rectify negative transitions at input Vin. The detector output is taken from the collectors of transistors Q3 and Q5 and is shown in FIG. 5A as current IR. The collectors of transistors Q4 and Q6 may be tied to the supply voltage and are typically not used. The PTAT bias voltage Vp, which is provided by the input emitter followers, is imposed across the differential pairs of the detector transistors.

For Vin=0:

$$IR = +2IK/(M\ exp(Vp/Vt)+1) \quad \text{(Eq. 2)}$$

Substituting Eq. 1 into Eq. 2 and simplifying gives:

$$IR = 2IK/(M\ N+1)\ \text{For Vin}=0 \quad \text{(Eq. 3)}$$

As seen in Eq. 3, the bias point is independent of temperature for Vin=0. This result is due to the fact that the exact PTAT voltage Vp, which is derived from unequal area transistors biased with identical currents, compensates for the temperature dependent bias required by the full wave detector transistors.

The value of N and M may be chosen as appropriate depending on the requirements of an application. It has been found that M=N=3 is suitable and provides a bias ratio of 10:1. Larger M and N values yield larger current ratios but possibly at the cost of high speed operation since transistors Q3 and Q5 will be biased at very low currents where speed is poor.

If Vin is included in the analysis, the dynamic current at the detector output is then:

$$IR(Vin) = IK/(1+M\ N\ exp(-Vin/Vt) + IK/(1+M\ N\ exp(Vin/Vt) \quad \text{(Eq. 4)}$$

The full-wave detector cell described above has a substantially constant slope w.r.t. temperature at the detector output as a function of input power (i.e., proportional to $Vin^2$) presented to the input port over a range of about an octave. As indicated in Eq. 4, however, the detector will yield an output whose d.c. level will still vary with temperature for Vin not equal to zero.

Figure 5B:
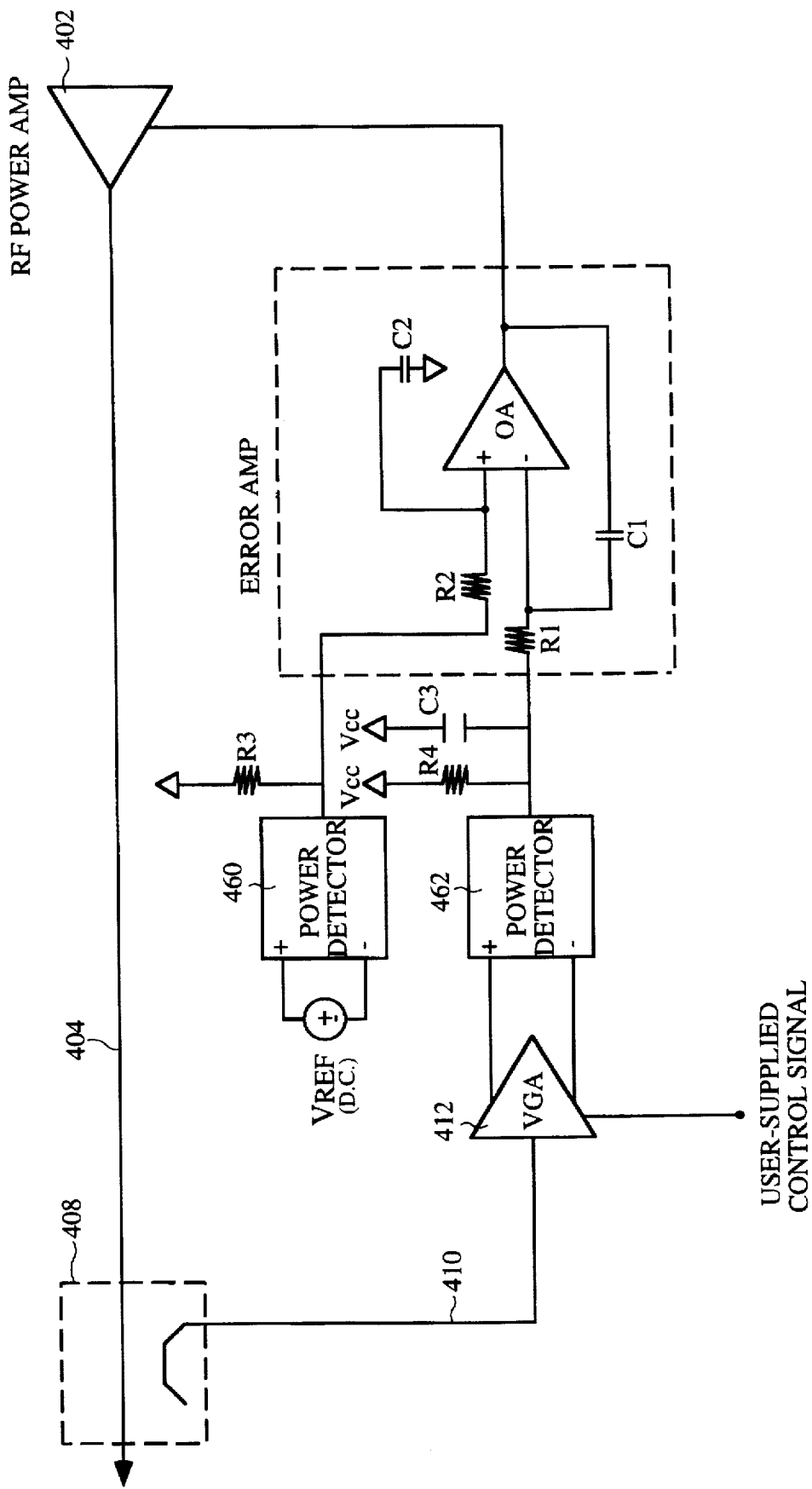
FIG. 5B shows, in accordance with another aspect of the present invention, a technique for compensating for thermal errors using the detector cell of FIG. 5A.

FIG. 5B shows, in accordance with another aspect of the present invention, a technique for compensating for this thermal error in a power amplifier control system. The technique involves using a second, redundant full-wave detector cell 460 to buffer the fixed reference voltage Vref. The output currents of detectors 460 and 462 of FIG. 5B are converted to voltages using resistors R3 and R4, which have substantially similar resistance values.

A capacitor C3 is optionally added to the detector output of detector 462 (i.e., the one coupled to the VGA) to pre-filter the rectified output current to an RMS d.c. level. The overall configuration provides temperature tracking to the actual error amplifier reference voltage to create a full-wave detector that is substantially temperature compensated under steady-state loop conditions. The nominal d.c. input reference voltage, Vref, is preferably provided on chip. Provisions may be added to allow the user to externally adjust the voltage of this d.c. input reference voltage, Vref, to calibrate the absolute accuracy of the entire power amplifier control system.

It should be borne in mind that the temperature compensated full-wave detector architectures of FIGS. 5A and 5B represent only exemplary ways to implement power detection and that there exist other known circuits for implementing the aforesaid power detection. Consequently, these power detection implementations are included herein for illustration purposes and should not be construed as limiting the scope of the claimed invention.

Likewise, conventional temperature compensation techniques may also be applied to VGA 412 to correct for temperature related errors therein. By way of example, temperature compensation techniques based on the use of a proportional-to-absolute-temperature (PTAT) current, which compensates for temperature-related gain variations in bipolar transistors, may be employed. Such temperature compensation circuitry may also be integrated into the same IC chip to save board space and component cost. Note that when such temperature compensation circuits are employed, the resulting RF signal source can be highly linear in terms of its amplitude control over a high bandwidth and a wide dynamic range and is also advantageously temperature stable.

In an alternative embodiment, the power controller of the present embodiment may be configured as a high bandwidth power sensor to provide an accurate and linear measure of the power output by an RF power amplifier over a wide dynamic range. The power sensor output may be read by, for example, a microcontroller, a microprocessor, or other suitable digital logic circuitry. Based on the level of power read, a control signal may then be provided to the RF power amplifier to modify its output.

Figure 6:
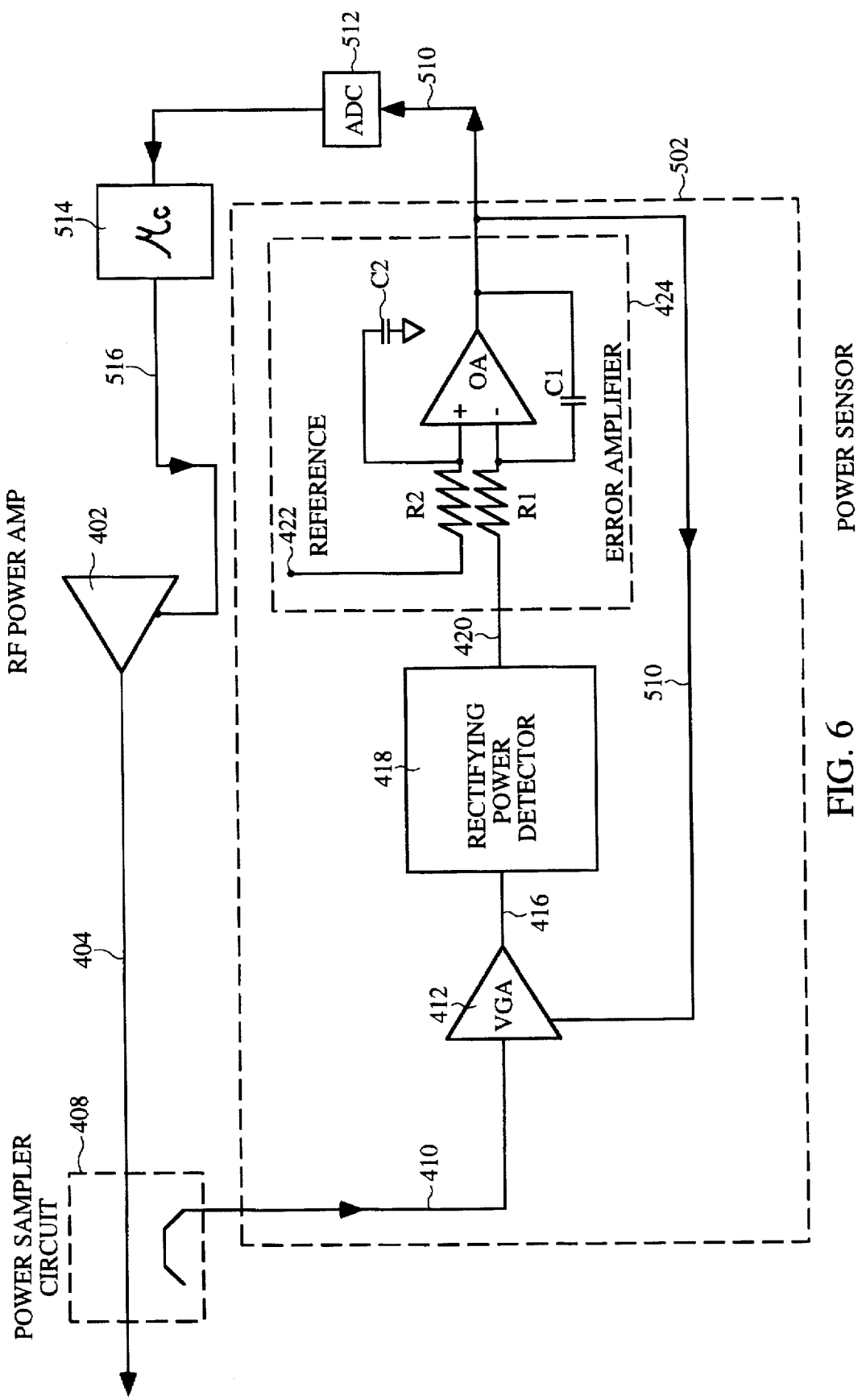
FIG. 6 shows, in accordance with yet another embodiment of the present invention, a linearized power sensor circuit.

FIG. 6 shows one implementation of this power sensor embodiment. In power sensor 502, RF power amplifier 402, RF power sampler circuit 408, VGA 412, power detector circuit 418, reference terminal 422, and error amplifier 424 are substantially similar to like components discussed and shown in FIG. 4. Note that no user-supplied control signal is input into VGA 412 in FIG. 4. Instead, the control input into VGA 412 is coupled (via line 510) to the error signal out of error amplifier 424. The same line 510 may also be used to couple the error signal to an analog-to-digital converter (ADC) 512 to provide a digital representation of this error signal into, for example, a microcontroller 514 (some microcontrollers may already have onboard an ADC, in which case ADC 512 may not be necessary). Responsive to this error signal, microcontroller 514 may then output a control signal on line 516 to adjust the output power level of RF power amplifier 402 to achieve a desired output power level.

It should be noted that the aforementioned advantages associated with the power controller of FIG. 4 also applies to the power sensor of FIG. 6. These advantages include: Highly linear power detection, temperature independent power detection, high bandwidth, wide dynamic range, and the ability to integrate (with or without the temperature compensation circuits) using standard technologies.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A power controller circuit for generating an error signal from an alternating current output signal of a power amplifier, a reference voltage level, and a control signal, comprising:

a power sampler circuit for sampling a portion of said output signal and outputting a sensed signal, said sensed signal being proportional to a power level of said output signal;

a variable gain amplifier having a first variable gain amplifier input and a second variable gain amplifier input, said first variable gain amplifier input being coupled to said power sampler circuit for receiving said sensed signal, said second variable gain amplifier input receiving said control signal, for outputting a variable gain amplifier output signal having a substantially constant peak-to-peak voltage irrespective of a power level of said output signal;

a power detector circuit coupled to said variable gain amplifier for receiving said variable gain amplifier output signal, said power detector circuit outputting a rectified signal;

an error amplifier having a first error amplifier input and second error amplifier input, said first error amplifier input being coupled to said power detector circuit for receiving said rectified signal, said second error amplifier input being coupled to said reference voltage level, whereby said error amplifier outputs said error signal responsive to a difference between said rectified signal and said reference voltage level; and whereby said variable gain amplifier is configurable to have either a substantially linear in dB gain control or a substantially linear in voltage gain control.

2. The power controller circuit of claim 1 wherein said power detector circuit further comprises a first temperature compensation circuit to render a transfer characteristic of said variable gain amplifier substantially independent of temperature variations.

3. The power controller circuit of claim 2 wherein said error amplifier circuit further comprises a second temperature compensation circuitry to render a transfer characteristic of said power detector circuit substantially independent of temperature variations.

4. The power controller circuit of claim 1 wherein said first alternating current has a dynamic range of about 40 dB.

5. The power controller circuit of claim 4 wherein a frequency of said first alternating current is above about 800 mega-hertz.

6. The power controller circuit of claim 5 wherein a frequency of said first alternating current is up to about 2.5 giga-hertz.

7. The power controller circuit of claim 4 wherein a frequency of said first alternating current is up to about 2.5 giga-hertz.

8. A method for obtaining a rectified signal from a first alternating current signal for use with a power amplifier having an output signal comprising:

inputting a control signal and said first alternating current signal into a variable gain amplifier to obtain a second alternating current signal, said second alternating current signal having a substantially constant peak-to-peak voltage irrespective of a power level of said first alternating current signal;

rectifying said second alternating current signal, using a power detector circuit, to obtain said rectified signal, whereby a direct current level of said rectified signal is substantially proportional to said power level of said first alternating current irrespective of said power level of said first alternating current; and whereby said variable gain amplifier is configurable to have either a substantially linear in dB gain control or a substantially linear in voltage gain control.

9. The method of claim 8 wherein said power detector comprises a first temperature compensation circuit to render a transfer characteristic of said variable gain amplifier substantially independent of temperature variations.

10. The method of claim 9 wherein said error amplifier circuit further comprises temperature compensation circuitry to render a transfer characteristic of said power detector circuit substantially independent of temperature variations.

11. The method of claim 8 wherein said first alternating current has a dynamic range of about 40 dB.

12. The method of claim 11 wherein a frequency of said first alternating current is above about 800 mega-hertz.

13. The method of claim 12 wherein a frequency of said first alternating current is up to about 2.5 giga-hertz.

14. The method of claim 8 wherein said first alternating current has a dynamic range of about 30 dB to about 40 dB.

* * * * *

UNITED STATES PATENT AND TRADEMARK OFFICE
CERTIFICATE OF CORRECTION

PATENT NO. : 5,724,003
DATED : March 3, 1998
INVENTOR(S) : Jensen et al.

It is certified that error appears in the above-identified patent and that said Letters Patent is hereby corrected as shown below:

Column 1, line 24, change "modem" to --modern--

Column 3, line 10, change "modem" to --modern--

Column 3, line 49, change "modem" to --modern--

Signed and Sealed this

Fourteenth Day of July, 1998

Attest:

BRUCE LEHMAN

*Attesting Officer*     *Commissioner of Patents and Trademarks*